(12) United States Patent
Gleissner et al.

(10) Patent No.: US 9,911,630 B2
(45) Date of Patent: Mar. 6, 2018

(54) APPARATUS FOR TREATING SURFACES OF WAFER-SHAPED ARTICLES

(71) Applicant: LAM RESEARCH AG, Villach (AT)

(72) Inventors: Andreas Gleissner, Dobriach (AT); Bhaskar Bandarapu, Villach (AT)

(73) Assignee: LAM RESEARCH AG, Villach (AT)

( * ) Notice: Subject to any disclaimer, the term of this patent is extended or adjusted under 35 U.S.C. 154(b) by 69 days.

(21) Appl. No.: 14/928,802

(22) Filed: Oct. 30, 2015

(65) Prior Publication Data

US 2017/0125266 A1 May 4, 2017

(51) Int. Cl.
*H01L 21/00* (2006.01)
*H01L 21/67* (2006.01)
*H01L 21/687* (2006.01)

(52) U.S. Cl.
CPC .... *H01L 21/67023* (2013.01); *H01L 21/6719* (2013.01); *H01L 21/67115* (2013.01); *H01L 21/68785* (2013.01); *H01L 21/68792* (2013.01)

(58) Field of Classification Search
None
See application file for complete search history.

(56) References Cited

U.S. PATENT DOCUMENTS

| 4,903,717 | A | 2/1990 | Sumnitsch |
| 5,513,668 | A | 5/1996 | Sumnitsch |
| 6,485,531 | B1 | 11/2002 | Schob |
| 2011/0290283 | A1* | 12/2011 | Obweger .......... H01L 21/68785 134/104.2 |
| 2013/0134128 | A1 | 5/2013 | Tschinderle et al. |
| 2015/0187629 | A1 | 7/2015 | Obweger et al. |

FOREIGN PATENT DOCUMENTS

WO 2007/101764 A1 9/2007

* cited by examiner

*Primary Examiner* — Michael Barr
*Assistant Examiner* — Jason Riggleman

(57) ABSTRACT

A device for processing wafer-shaped articles comprises a closed process chamber providing a gas-tight enclosure, and a rotary chuck located within the closed process chamber. The closed process chamber comprises an annular duct surrounding the rotary chuck and extending along a first direction radially outwardly of the rotary chuck and obliquely to a rotary axis of the rotary chuck, from an inlet end that communicates with the rotary chuck to an outlet end that communicates with an exhaust duct. The annular duct comprises a duct section extending between the inlet and outlet ends that is defined by an inner chamber wall spaced apart from an outer chamber wall. The extent of the duct section along the first direction is at least twice a spacing of the inner and outer chamber walls throughout the duct section, as measured in a direction perpendicular to the first direction.

10 Claims, 2 Drawing Sheets

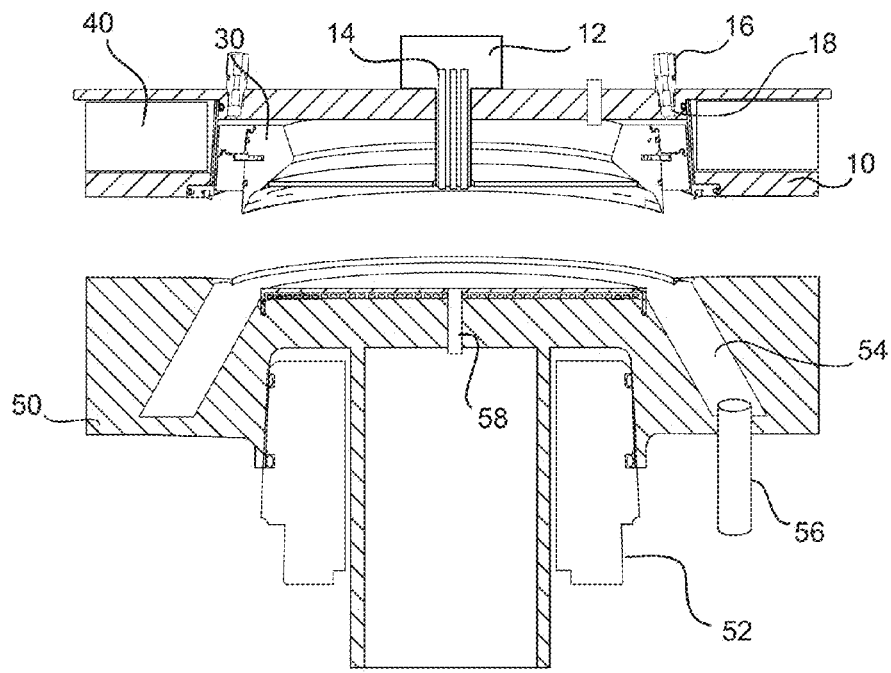
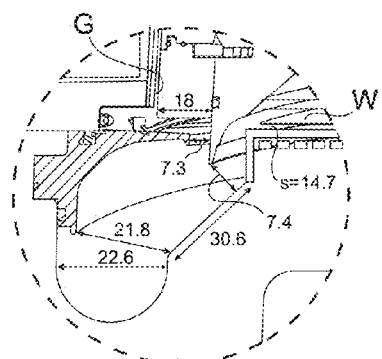
Fig. 4
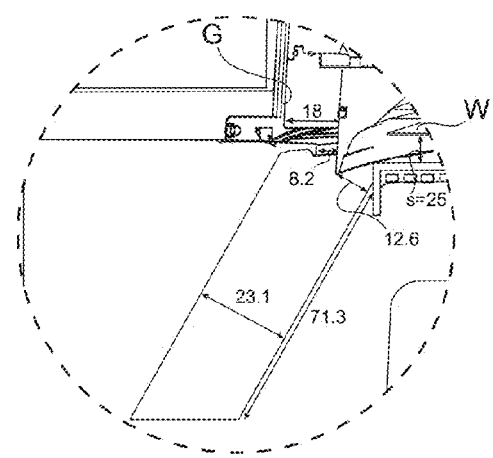
Fig. 5

APPARATUS FOR TREATING SURFACES OF WAFER-SHAPED ARTICLES

BACKGROUND OF THE INVENTION

1. Field of the Invention

The invention relates generally to an apparatus for treating surfaces of wafer-shaped articles, such as semiconductor wafers, wherein one or more treatment fluids may be recovered from within a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668. Such fluids can be liquids and/or gases supplied to the wafer-shaped articles.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

For many applications the closed process chamber needs to be purged with ozone or an inert gas such as nitrogen, prior to commencement of a given process, or between successive processes. Additionally, for many applications the process chambers also need to be cleaned, for example by rinsing with deionized water.

Designs for closed chamber single wafer wet processing are described in commonly-owned copending applications U.S. Pub. Nos. 2013/0134128 and 2015/0187629, in which the lid for the chamber is equipped with a structure for fluid distribution so as to purge the space between the magnetic ring rotor and chamber wall.

The present inventors have discovered that the functionality of existing closed chamber spin chucks is impaired by turbulence in the flow of fluids within the chamber, and especially in the bottom area of the chamber.

SUMMARY OF THE INVENTION

Thus, in one aspect, the present invention relates to a device for processing wafer-shaped articles, comprising a closed process chamber providing a gas-tight enclosure, and a rotary chuck located within the closed process chamber. The rotary chuck is adapted to hold a wafer shaped article of a predetermined diameter thereon. The closed process chamber comprises an annular duct surrounding the rotary chuck and extending along a first direction radially outwardly of the rotary chuck and obliquely to a rotary axis of the rotary chuck, from an inlet end that communicates with the rotary chuck to an outlet end that communicates with an exhaust duct. The annular duct comprises a duct section extending between the inlet and outlet ends that is defined by an inner chamber wall spaced apart from an outer chamber wall. Each of the inner chamber wall and outer chamber wall is frustoconical and the first direction is defined as a line whose position is intermediate and equidistant the inner and outer walls over a majority of their length. The extent of the duct section along the first direction is at least twice a spacing of the inner and outer chamber walls throughout the duct section, as measured in a direction perpendicular to the first direction.

In preferred embodiments of the device according to the present invention, the rotary chuck is configured to hold a wafer-shaped article such that a surface of the wafer-shaped article that faces away from the rotary chuck is positioned in a predetermined plane. The device further comprises a plate positioned generally parallel to the predetermined plane and on an opposite side of the predetermined plane than the rotary chuck, the plate being spaced from the predetermined plane by a distance that is at least 75%, and preferably at least 85%, of the spacing of the inner and outer chamber walls.

In preferred embodiments of the device according to the present invention, the plate is a heater.

In preferred embodiments of the device according to the present invention, the rotary chuck comprises a cylindrical peripheral surface facing a cylindrical wall of the closed process chamber to define an annular gap, and the device is configured to supply gas to one end of the gap so as to purge the gap, an opposite end of the gap communicating with the inlet of the annular duct.

In preferred embodiments of the device according to the present invention, the chuck is a magnetic ring rotor positioned inside the chamber, and surrounded by a stator positioned outside the chamber.

In preferred embodiments of the device according to the present invention, the heater emits radiation having a maximum intensity in a wavelength range from 390 nm to 550 nm, preferably from 400 nm to 500 nm.

In preferred embodiments of the device according to the present invention, at least one first liquid dispenser is positioned relative to the chuck so as to dispense a process liquid onto a first side of a wafer shaped article when held on the chuck.

In preferred embodiments of the device according to the present invention, at least one second liquid dispenser is positioned relative to the chuck so as to dispense a process liquid onto a second side of a wafer shaped article opposite the first side of the wafer shaped article.

In preferred embodiments of the device according to the present invention, the extent of the duct section along the first direction is at least 2.5 times the spacing of the inner and outer chamber walls throughout the duct section.

In preferred embodiments of the device according to the present invention, the spacing of the inner and outer chamber walls throughout the duct section is at least ten times greater than a thickness of the annular gap.

In preferred embodiments of the device according to the present invention, each of the inner chamber wall and outer chamber wall is frustoconical, and forms an angle in a range of 20° to 60° with the axis of rotation of the rotary chuck, preferably 20° to 50°, and more preferably 20° to 40°.

In preferred embodiments of the device according to the present invention, the spacing of the inner and outer chamber walls varies by less than 10% along an entire extent of the duct section.

In preferred embodiments of the device according to the present invention, the angle of the inner chamber wall differs from the angle of the outer chamber wall by less than 5%.

In preferred embodiments of the device according to the present invention, the extent of the duct section along the first direction is at least 15% of the predetermined diameter.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 3 is a view of the embodiment of FIG. 2, in which the chamber has been opened to receive a wafer;

FIG. 4 shows the detail IV of FIG. 1 on a larger scale; and

FIG. 5 shows the detail V of FIG. 2 on a larger scale.

DETAILED DESCRIPTION OF PREFERRED EMBODIMENTS

In devices for processing semiconductor wafers wherein a rotary chuck for holding a single wafer is mounted within a closed process chamber, the functionality of the technology is dependent on process fluids flowing correctly through the device. The present inventors have discovered, however, that such devices have disadvantages in that the flow becomes excessively turbulent, especially in the bottom area of the chamber. This turbulent flow generates strong resistance to the desired downward flow, especially in the thin gap between the chuck and the chamber wall, in the case of using a magnetic ring rotor as the chuck.

This flow resistance can even lead to a reversal of the flow direction in the gap, especially when the chuck is being rotated at high rpm and the magnitude of turbulence correspondingly larger. This reversed gas flow can entrain droplets of process liquid and transport them to regions of the device that should not be contacted by the process liquids, such as the narrow gap being a magnetic ring rotor and the chamber wall. This undesired phenomenon can occur even when a high flow of purge gas is used to prevent the ingress of liquid droplets into the gap.

In certain cases, these liquid droplets were transported all the way to top lid of the chamber, from whence they can fall onto the wafer and create defects and cross-contamination.

A new concept as described herein has been developed to address this issue and reduce the effect of recirculation in the gap as well as below the wafer at lower purge flow, which in turn yields lower cost of ownership during the operation.

Figure 1:
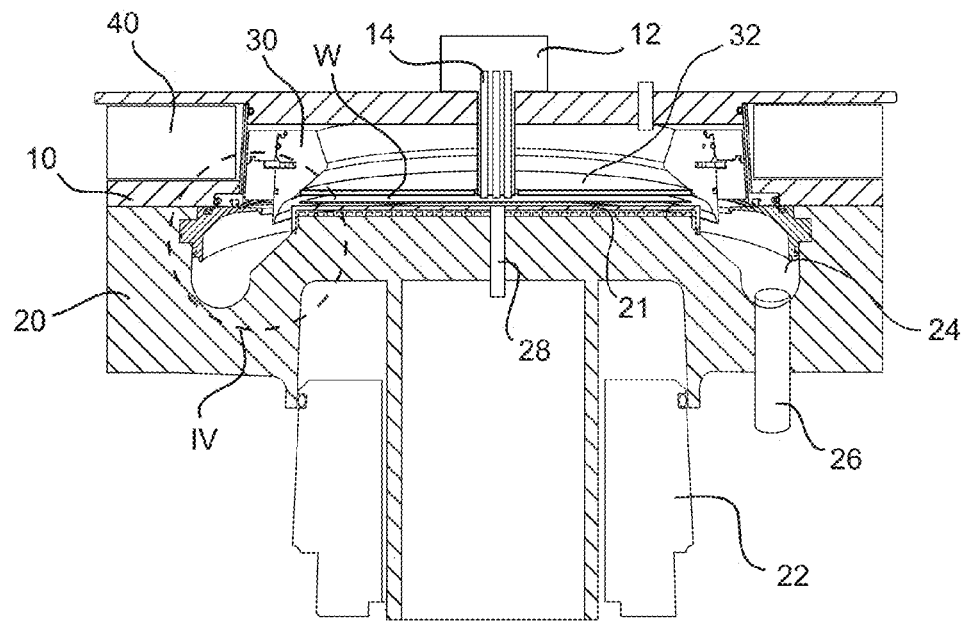
FIG. 1 is an explanatory cross-sectional side view of a comparative process chamber whose exhaust duct configuration is conventional.

Referring now to FIG. 1, a comparative device for treating surfaces of wafer-shaped articles is constructed according to a first embodiment of the invention, but is provided with a conventional duct structure for handling fluid flow. Upper chamber part 10 and lower chamber part 20 are joined together and a wafer W is held by the rotary chuck 30. Chuck 30 in this embodiment is a magnetic ring rotor, which is driven in rotation via a stator 40 mounted outside the chamber, and on the upper chamber part 10. Stator 40 also maintains magnetic rotor 30 suspended within the upper chamber part 10, without contact between the rotor 30 and upper chamber part 10.

The rotor 30 and stator 40 serve as a motor by which the ring rotor 30 (and thereby a supported wafer W) may be rotated through an active magnetic bearing. For example, the stator 40 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

Wafer W depends downwardly from the ring rotor chuck 30, and is held by a circular series of gripping pins (not shown) that project downwardly from the rotor ring 30, in a manner known per se.

Process gases and or liquids can be supplied to the upwardly facing side of wafer W via manifold 12 and one or more conduits 14, which pass through a central opening in a guard plate 32 so as to open above the wafer W.

Lower chamber part 20 is equipped with a heating assembly 21 which in this embodiment is an array of blue LED elements covered by a plate that is substantially transparent to the radiation emitted by the LED elements, for example a quartz plate. Heating assembly 21 preferably emits radiation having a maximum intensity in a wavelength range from 390 nm to 550 nm, more preferably from 400 nm to 500 nm.

Lower chamber part 20 moves vertically on a stationary support frame 22 to permit the chamber to be opened and closed. Annular duct 24 surrounds the chuck 30, and communicates with a discharge conduit 26.

Lower chamber part 20 also includes at least one first liquid dispenser 28 that is positioned relative to the chuck 30 so as to dispense a process liquid onto the side of wafer W that faces away from the chuck 30.

Figure 2:
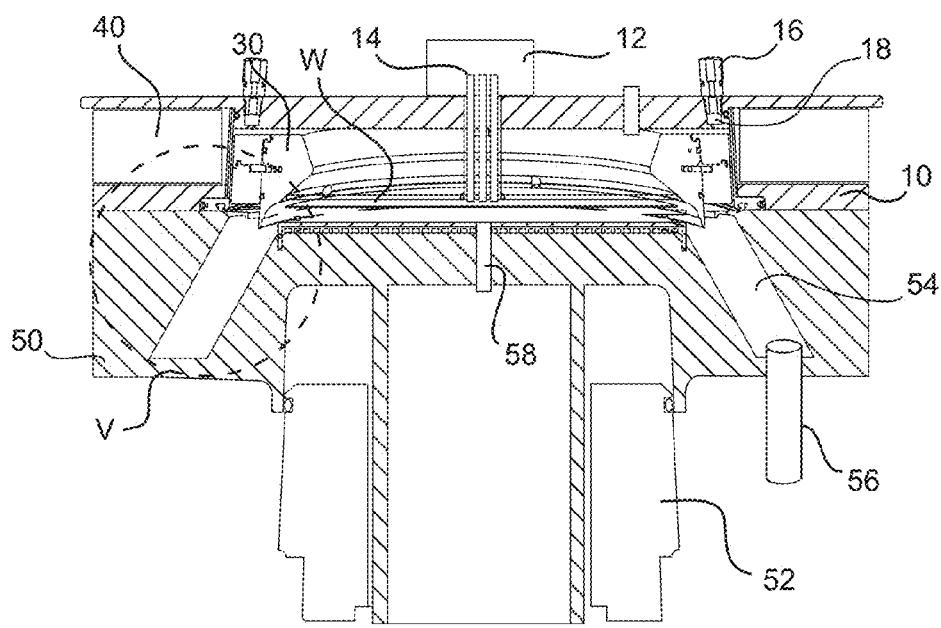
FIG. 2 is an explanatory cross-sectional side view of a process chamber according to a first embodiment of the present invention, with the chamber being closed and containing a wafer to be processed.

In FIG. 2, like elements are referenced with like reference numerals, and it will be seen that the annular duct 54 formed in lower chamber part 50 has been redesigned relative to duct 24 in FIG. 1. Also shown in FIG. 2 are inlet ports 16 for a purge gas, such as nitrogen gas, which is distributed via an annular chamber 18 and associated discharge orifices toward the narrow annular gap G that exists between the chuck 30 and the surrounding cylindrical chamber wall. As discussed above, however, provision of such purging of the gap G is alone insufficient to prevent droplets of process liquid from being entrained by the reversed turbulent flow that is created when the chuck 30 is rotated at high rpm.

In FIG. 3, the device of FIG. 2 is shown with the chamber opened, i.e., lower chamber part 50 has been moved downwardly relative to support frame 52. In this position, a wafer W can be loaded onto the chuck 30 or unloaded therefrom.

FIGS. 4 and 5 compare details of the geometry of the conventional and inventive annular duct configurations, respectively. The numbers used in FIGS. 4 and 5 are dimensions in millimeters, although the illustrations are not strictly to scale. In general, it can be seen that the duct 54 of FIG. 5 is substantially deeper than the duct 24 of FIG. 4. Furthermore, the gap s between the quartz plate of the heating assembly 21 and the position at which chuck 30 holds wafer W is substantially increased for the duct 54 in relation to duct 24.

The present inventors have found that this new configuration of the annular duct and heating assembly significantly improve the flow distribution below the wafer, by disrupting turbulence vortices and preventing flow reversal in the thin gap G between the chuck 30 and the adjacent cylindrical chamber wall.

In greater detail, the annular duct 54 of FIG. 5 surrounds the rotary chuck and extends along a first direction radially outwardly of the rotary chuck and obliquely to a rotary axis of the rotary chuck, from an inlet end that communicates with the rotary chuck to an outlet end that communicates with an exhaust duct. This is the direction whose dimension is indicated as being 71.3 mm in FIG. 5.

The annular duct 54 comprises a duct section extending between the inlet and outlet ends that is defined by an inner chamber wall spaced apart from an outer chamber wall. The extent of the duct section along the first direction is at least twice the spacing of the inner and outer chamber walls throughout the duct section, as measured in a direction perpendicular to the first direction. The spacing is indicated as being 23.1 mm in FIG. 5, with the length of duct section thus being 46.2 mm or greater.

As shown in FIG. 5, the heating assembly 21 is spaced from wafer W by 25 mm. More generally, the spacing being wafer W and heating assembly 21 is preferably at least 75%, and more preferably at least 85%, of the spacing of the inner and outer chamber walls along the duct section.

The spacing of the inner and outer chamber walls throughout the duct section is also at least ten times greater than the thickness of the annular gap between chuck 30 and surrounding chamber wall. Thus, the gap G is preferably 2.3 mm or less, in the embodiment of FIG. 5.

It will be noted that in the embodiment of FIG. 5, each of the inner chamber wall and outer chamber wall is frusto-conical, and forms an angle in a range of 20° to 60° with the axis of rotation of the rotary chuck, preferably 20° to 50°, and more preferably 20° to 40° Furthermore, these walls are generally parallel to one another, such that the spacing of the inner and outer chamber walls varies by less than 10% along an entire extent of the duct section. Stated differently, the angle of the inner chamber wall differs from the angle of the outer chamber wall by less than 5%.

Chuck 30 is designed to hold a single wafer of a predetermined diameter. For example, silicon wafers used to fabricate semiconductor devices are currently 300 mm or 450 mm. The extent of the extent of the duct section along the first direction may also advantageously be selected to be at least 15% of the diameter of a wafer to be held by chuck 30, thus at least 45 mm or at least 67.5 mm for chucks designed to hold wafers of 300 mm or 450 mm diameter, respectively.

It will be understood that the foregoing description and specific embodiments shown herein are merely illustrative of the invention and the principles thereof, and that modifications and additions may be easily made by those skilled in the art without departing from the spirit and scope of the invention, which is therefore understood to be limited only by the scope of the appended claims.

What is claimed is:

1. A device for processing wafer-shaped articles, comprising:
    a closed process chamber providing a gas-tight enclosure;
    a rotary chuck located within said closed process chamber, said rotary chuck being adapted to hold a wafer shaped article of a predetermined diameter thereon, wherein said rotary chuck being a magnetic ring rotor positioned inside said closed process chamber and surrounded by a stator positioned outside said closed process chamber;
    said closed process chamber comprising an annular duct of length X and width Y surrounding said rotary chuck and extending along a first direction radially outwardly of said rotary chuck and obliquely to a rotary axis of said rotary chuck, from an inlet end that communicates with said rotary chuck to an outlet end that communicates with an exhaust duct, where X is greater than or equal to 2Y; and
    a plate positioned parallel to said rotary chuck at a distance of at least 0.75Y from said rotary chuck, wherein said plate comprises a heater.

2. The device according to claim 1, further comprising an annular gap between a periphery of said rotary chuck and a cylindrical wall of said closed process chamber to allow flow of a purge gas through said annular gap, said annular gap communicating with said inlet end of said annular duct.

3. The device according to claim 1, further comprising at least one first liquid dispenser positioned relative to said rotary chuck to dispense a first process liquid onto a first side of the wafer shaped article when held on said rotary, chuck.

4. The device according to claim 3, further comprising at least one second liquid dispenser positioned relative to said rotary chuck to dispense a second process liquid onto a second side of the wafer shaped article opposite the first side of the wafer shaped article.

5. The device according to claim 1, wherein X is greater than or equal to 2.5Y.

6. The device according to claim 2, wherein Y is at least ten times greater than a thickness of said annular gap.

7. The device according to claim 1, wherein said annular duct forms an angle in a range of 20° to 60° with the rotary axis of said rotary chuck, 20° to 50°, or 20° to 40°.

8. The device according to claim 1, wherein Y varies by less than 10% along an entire extent of said annular duct.

9. The device according to claim 1, wherein X is at least 15% of said predetermined diameter.

10. The device according to claim 1, wherein said distance is at least 0.85Y from said rotary chuck.

* * * * *